United States Patent
Marinov et al.

(10) Patent No.: US 9,899,853 B2
(45) Date of Patent: Feb. 20, 2018

(54) AC POWER SUPPLY

(71) Applicant: TWS (Macau Commercial Offshore) Limited, Macau (CN)

(72) Inventors: Peter Marinov, Stirling (GB); Dominic Reilly, Stirling (GB)

(73) Assignee: TWS (MACAU COMMERCIAL OFFSHORE) LIMITED, Macau (CN)

( * ) Notice: Subject to any disclaimer, the term of this patent is extended or adjusted under 35 U.S.C. 154(b) by 98 days.

(21) Appl. No.: 14/777,708

(22) PCT Filed: Mar. 20, 2014

(86) PCT No.: PCT/GB2014/000105
§ 371 (c)(1),
(2) Date: Sep. 16, 2015

(87) PCT Pub. No.: WO2014/147366
PCT Pub. Date: Sep. 25, 2014

(65) Prior Publication Data
US 2016/0285295 A1  Sep. 29, 2016

(30) Foreign Application Priority Data

Mar. 21, 2013 (GB) .................................. 1305186.7
Jun. 3, 2013 (CN) .......................... 2013 1 0216644

(51) Int. Cl.
| H02J 7/00 | (2006.01) |
| H05K 7/14 | (2006.01) |
| H05K 7/20 | (2006.01) |
| H01M 2/10 | (2006.01) |

(Continued)

(52) U.S. Cl.
CPC ......... *H02J 7/0054* (2013.01); *H01M 2/1022* (2013.01); *H01M 10/4257* (2013.01);
(Continued)

(58) Field of Classification Search
CPC ............. H01M 10/4257; H01M 10/46; H01M 2010/4271; H01M 2010/4278;
(Continued)

(56) References Cited

U.S. PATENT DOCUMENTS 5,982,138 A    11/1999  Krieger
2001/0000945 A1  5/2001  Watson et al.
(Continued)

FOREIGN PATENT DOCUMENTS

| WO | 2008106450 A1 | 9/2008 |
| WO | 2011155625 A1 | 12/2011 |
| WO | 2011155626 A1 | 12/2011 |

OTHER PUBLICATIONS

ISA International Search Report, PCT/GB2014/000105, Jul. 31, 2014, 5 pages.
ISA, Written Opinion, PCT/GB2014/000105, Mar. 20, 2014, 7 pages.
GB Search Report for GB1305186.7, Aug. 23, 2013, 2 pages.

*Primary Examiner* — Vuthe Siek
(74) *Attorney, Agent, or Firm* — Drinker Biddle & Reath LLP

(57) ABSTRACT

A portable alternating current power supply assembly which has an extendable operational period and which provides an external power supply for a tool. It has a power inverter and a removable battery unit which is connectable to the power inverter by a coupling to form the power supply and which when so connected forms a discrete unit. A DC output from the removable battery unit is converted to a pure sine wave AC output from the power supply assembly by the power inverter. The power inverter is separable from the battery unit to provide an operational period for the power supply assembly which is equivalent to that which might be provided using larger AC power supplies which have larger DC voltage batteries and which are part of a sealed unit with the power inverter.

30 Claims, 6 Drawing Sheets

(51) Int. Cl.
*H01M 10/42* (2006.01)
*H01M 10/46* (2006.01)

(52) U.S. Cl.
CPC ............. *H01M 10/46* (2013.01); *H02J 7/007* (2013.01); *H02J 7/0045* (2013.01); *H02J 7/0065* (2013.01); *H05K 7/1432* (2013.01); *H05K 7/20909* (2013.01); *H01M 2010/4271* (2013.01); *H01M 2010/4278* (2013.01); *H01M 2220/30* (2013.01); *H02J 2007/0059* (2013.01)

(58) Field of Classification Search
CPC ............. H01M 2220/30; H01M 2/1022; H02J 2007/0059; H02J 7/0045; H02J 7/0054; H02J 7/0065; H02J 7/007; H05K 7/1432; H05K 7/20909
See application file for complete search history.

(56) References Cited

U.S. PATENT DOCUMENTS

| | | | |
|---|---|---|---|
| 2001/0043052 A1* | 11/2001 | Griffey | H02M 7/003 320/114 |
| 2011/0090726 A1 | 4/2011 | Brotto et al. | |
| 2011/0101794 A1* | 5/2011 | Schroeder | H01M 2/1022 307/150 |
| 2012/0007446 A1 | 1/2012 | Ro | |
| 2012/0313431 A1 | 12/2012 | Shum et al. | |
| 2013/0260188 A1* | 10/2013 | Coates | H01M 10/42 429/50 |
| 2014/0244225 A1* | 8/2014 | Balasingam | G06F 17/5036 703/2 |

* cited by examiner

AC POWER SUPPLY

This application is a 371 of PCT/GB2014/000105 Mar. 20, 2014.

INTRODUCTION

The present invention relates to an alternating current (AC) power supply which is suitable for use as a power source for devices such as heavy duty power tools but is not limited to this application.

BACKGROUND

In many situations, there is a need to provide electrical power to electrically operated equipment where mains electricity is not available, for example on a construction site which is not yet connected to the mains electricity supply or is in a remote location. Tools such as electrically driven hammer drills, breakers chisels and drills often require a power source which is capable of providing sufficient power in order to operate effectively.

The most common current solution to this problem is to use an ICE (internal combustion engine) generator. Engine generators are available in a wide range of power ratings and include small, hand-portable units that can supply several hundred watts of power, hand-cart mounted units that can supply several thousand watts and stationary or trailer-mounted units that can supply over a million watts.

Engine generators run on petrol, diesel, natural gas, propane, bio-diesel, sewage gas or hydrogen and need water for cooling. Most of the smaller units are built to use petrol as a fuel, and the larger ones have various fuel types, including diesel, natural gas and propane (liquid or gas). A typical 2 kW generator might weigh 50-60 Kilograms (Kg), be mounted on rails and have dimensions [in centimetres (cm)] of 50×50×50.

The advantage of engine generators is that they can provide a source of electrical power at the required level which is constrained only by the amount of fuel available and the tank capacity; operating times of around 10 hours per tank of fuel are typical. However, engine generators are relatively bulky and heavy for one person use and are unsafe to use in-doors because of the fumes generated by the engine.

An alternative to the engine generator is to use batteries as the energy source for the power supply. Power supplies of this type are often referred to as Power Packs. Power Packs capable of providing around 2 kW for example, typically comprise sealed battery units which contain a rechargeable battery with voltage higher than 110V. Power packs of this type require a battery which is larger in volume and weight that is deemed suitable for a single user; the use of smaller batteries means that the battery capacity is deemed insufficient to power the tools for a sufficient time.

In addition, safety considerations mean that batteries with a voltage of greater than around 64V must not be detachable in order to conform to the CE mark battery directive. A number of prior art documents have been identified US2012/0007446 discloses a combined power source and inverter which is mountable on a mobile device such as an electric bicycle. The device has an inverter located in a sleeve into which a battery may be inserted in use. The device also has an output socket which may be used to power low power AC or DC devices in addition to the normal battery output for providing power to the mobile device (E-bike).

WO2011/155625/6 Hitachi shows a power tool (lawn mower) with an integrated battery/inverter. The object of this is to allow the lawn mower to be used with mains AC then with battery AC when it is out of its power cord range.

US2012/0313431 Shum discloses a DC battery which is fixed in position in a car or similar vehicle. The battery is fitted with an inverter mounted on the top of the battery and which has electrical sockets so that other devices may be plugged in to the inverter to obtain an AC output.

US2001/0043055 Griffey shows a mobile AC power supply which has a maximum power output of around 300 W.

US5982138 Krieger discloses a portable electrical energy source. In particular, this device is a portable jump starter for starting cars or the like. The device has a detachable inverter which may be used for low power applications.

The prior art documents identified in general describe a device which, in one form or another contains a battery and an inverter. However, in some cases, these are integrally formed with the device which is being powered such as US2012/0007446, WO2011/155625/6, and US2012/0313431) or are specifically designed for low power applications such as US2001/0043055 with an inverter generating square or modified sine wave.

The problem addressed by the present invention is to provide a portable AC Power Supply which may be used as a power source for high power tools. None of the cited prior art documents address this problem.

SUMMARY OF THE INVENTION

It is an object of the invention to provide a battery powered AC Power Supply which can provide power to a range of user applications which have differing weight versus capacity/power requirements.

It is another object of the present invention for the AC Power Supply to be mobile or portable. In the context of the present invention mobile or portable means that it can be safely carried by a single person.

In accordance with a first aspect of the invention there is provided a portable alternating current power supply assembly which has an extendable operational period and which provides an external power supply for a tool, the power supply assembly comprising:

a power inverter for converting direct current (DC) into alternating current (AC); and a removable battery unit which is connectable to the power inverter by a coupling to form the power supply and which when so connected forms a discrete unit and such that in use, a DC output from the removable battery unit is converted to an AC output from the power supply assembly by the power inverter, the operational period of the power supply assembly being extended by replacement of the battery unit when a portion of the energy in the battery unit has been used.

Advantageously, the present invention provides a power assembly in which the s power inverter is separable from the battery unit to provide an operational period for the power supply assembly which is equivalent to that which might be provided using larger AC power supplies which have larger DC voltage batteries and which are part of a sealed unit with the power inverter. Advantageously, the present invention can use smaller batteries and by replacing used battery units can achieve the same operational life and power output of a heavier and larger AC power supply.

Advantageously, by splitting the power supply into inverter and battery, a spare battery could be introduced. The spare battery allows a depleted battery to be swapped for a fully charged one. The depleted battery can be charged while the new charged battery is discharging allowing the user to continue to operate the portable AC supply.

A further advantage is that the operational life of the power inverter typically exceeds that of a battery. Therefore, the present invention avoids the needless scrapping of a working inverter which has not reached the end of its operational life.

Preferably, the alternating current is pure sine wave alternating current which may be used as a power source for high power tools as defined herein.

Preferably, the power supply is designed to provide power to devices which require up to 3 kW RMS (root mean square) power.

Preferably, the power supply is designed to provide power to devices which require between 1 kW and 3 kW RMS (root mean square) power.

More preferably, the power supply is designed to provide power to devices which require up to 2 kW RMS power.

Preferably, the coupling provides an electrical connection between the power inverter and the battery unit and a mechanical coupling which removably secures the power inverter to the battery unit.

Optionally, the coupling comprises:

a power inverter coupling which comprises a recessed area on the underside of the inverter, the recessed area having an electrical connector and a mechanical connector; and a battery unit coupling which projects from the battery unit.

Preferably, the mechanical connector is provided by a flanged lip, the recessed area forming a receiving channel Preferably, the battery unit coupling comprises an electrical connector and an abutting surface which provides a mechanical connection with the flanged lip when the connected thereto.

Optionally, the coupling comprises a male/female coupling.

Optionally, the coupling further comprises a lock.

Preferably, the power supply assembly has a weight of between 15 and 30 Kg.

Preferably, the power supply assembly has a height of between 10 and 40 cm

Preferably, the power supply assembly has a breadth of between 10 and 40 cm

Preferably, the power supply assembly has a depth of between 10 and 40 cm

Preferably, the power supply assembly comprises a battery with a voltage of 35 to 64 volts DC.

Preferably, the power inverter is adapted to convert the DC voltage of the battery to provide an output from the power supply assembly which is 200 to 250V or 90 to 130V AC at a frequency of 40 to 60 Hz.

Preferably, the inverter has a pure sinewave output.

Advantageously, this provides a very flexible power source which may be used with a wide range of devices.

Preferably, the power supply assembly further comprises a carry handle.

Preferably, the carry handle is situated on the top of the power supply assembly.

Preferably, the carry handle is situated on the top of the power inverter of the power supply assembly.

Preferably, the battery comprises a battery management system which is removably connected to the inverter via the coupling.

Preferably, the battery comprises an integral charger.

Preferably, the battery has a voltage of between 35 and 64V.

More preferably, the battery has a nominal voltage of 48V

Preferably, the battery has a power output of between 1500 W and 2500 W

More preferably, the battery has a power output of 1800 W.

Preferably, the battery management system comprises a microprocessor and data acquisition means.

Preferably, the battery management system is in communication with the integral charger, the battery and the load.

Preferably, the battery management system communicates with the load to detect and manage one or more of mains system power switching, battery disconnection, operating performance and load faults.

Preferably, the battery management system communicates with the charger to control the charge voltage and/or the charge current.

Preferably, the battery management system communicates with the charger to enable the charger and/or to detect power supply to the charger.

Preferably, the battery management system communicates with the battery to obtain fuel gauge information such as measure one or more of cell voltage, cell temperature, battery voltage and battery current.

Preferably, the battery management system communicates with the battery to control battery charge and discharge.

Preferably, the battery management system further comprises software which creates a graphical user interface on a host device such as a personal computer where battery management information is displayable.

In accordance with a second aspect of the invention there is provided a power inverter for converting direct current (DC) into alternating current (AC) in an alternating current power supply assembly which has an extendable operational period, the power inverter comprising:

a coupling which removably connects the power inverter to a removable battery unit to form the power supply and which when so connected forms a discrete unit and such that in use, a DC output from the removable battery unit is converted to an AC output from the power supply assembly by the power inverter, the operational period of the power supply assembly being extended by replacement of the battery unit when a portion of the energy in the battery unit has been used.

Preferably, the power supply is designed to provide power to devices which require up to 3 kW RMS power.

More preferably, the power supply is designed to provide power to devices which require up to 2 kW RMS power.

Preferably, the coupling provides an electrical connection between the power inverter and the battery unit and a mechanical coupling which removably secures the power inverter to the battery unit.

Optionally, the coupling comprises:

a power inverter coupling which comprises a recessed area on the underside of the inverter, the recessed area having an electrical connector and a mechanical connector; and a battery unit coupling which projects from the battery unit.

Preferably, the mechanical connector is provided by a flanged lip, the recessed area forming a receiving channel Preferably, the battery unit coupling comprises an electrical connector and an abutting surface which provides a mechanical connection with the flanged lip when the connected thereto.

Optionally, the coupling further comprises a lock.

Optionally, the coupling comprises a male/female coupling.

Preferably, the power inverter is adapted to convert the DC voltage of tie battery to provide an output from the power supply assembly which is 200 to 250V or 90 to 130V AC at a frequency of 40 to 60 Hz.

Preferably, the power inverter further comprises a carry handle.

Advantageously, the power inverter may be used with multiple batteries (as spares)

A battery unit which is removably connected to an electrical load, the battery unit comprising:

a mechanical coupling for removably connecting the battery unit to the load an electrical coupling which supplies power to the load;

a communications link which allows information to be transferred to and from the load; wherein the battery unit further comprises a battery management system and an integral charger.

Preferably, the battery has a voltage of between 35 and 64V.

More preferably, the battery has a nominal voltage of 48V

Preferably, the battery has a power output of between 1500 W and 2500 W

More preferably, the battery has a power output of 1800 W.

Preferably, the battery management system comprises a microprocessor and data acquisition means.

Preferably, the battery management system is in communication with the integral charger, the battery and the load.

Preferably, the battery management system communicates with the load to detect and manage one or more of mains system power switching, battery disconnection, operating performance and load faults.

Preferably, the battery management system communicates with the charger to control the charge voltage and/or the charge current.

Preferably, the battery management system communicates with the charger to enable the charger and/or to detect power supply to the charger.

Preferably, the battery management system communicates with the battery to obtain fuel gauge information such as measure one or more of cell voltage, cell temperature, battery voltage and battery current.

Preferably, the battery management system communicates with the battery to control battery charge and discharge.

Preferably, the battery management system further comprises software which creates a graphical user interface on a host device such as a personal computer to where battery management information is displayable.

Preferably, the load is an inverter as described in the first and second aspect of the invention.

Preferably, the battery unit coupling comprises an electrical connector and an abutting surface which provides a mechanical connection with the flanged lip when the connected thereto.

BRIEF DESCRIPTION OF THE DRAWINGS

The present invention will now be described by way of example only, with reference to the accompanying drawings in which.

DETAILED DESCRIPTION OF THE DRAWINGS

The present invention comprises an AC Power Supply and separately, a battery unit and an inverter which may be coupled together to provide the AC Power supply. The battery may be used as an energy source for other loads without using the inverter.

The invention provides a dedicated mechanical interface designed to allow for different attachments to plug into and form a complete unit with the battery It is particularly useful as a mid power source for devices such as electrically driven hammer drills, breakers chisels and drills. The pure sine wave output allows for any type of device to be powered by the inverter;

In addition it provides a graphical user interface which is readily displayed on a host device such as a PC for reporting main functional and protection parameters of the battery and the inverter. It also allows for plug and play of any supported attachment to the battery.

Figure 1A:
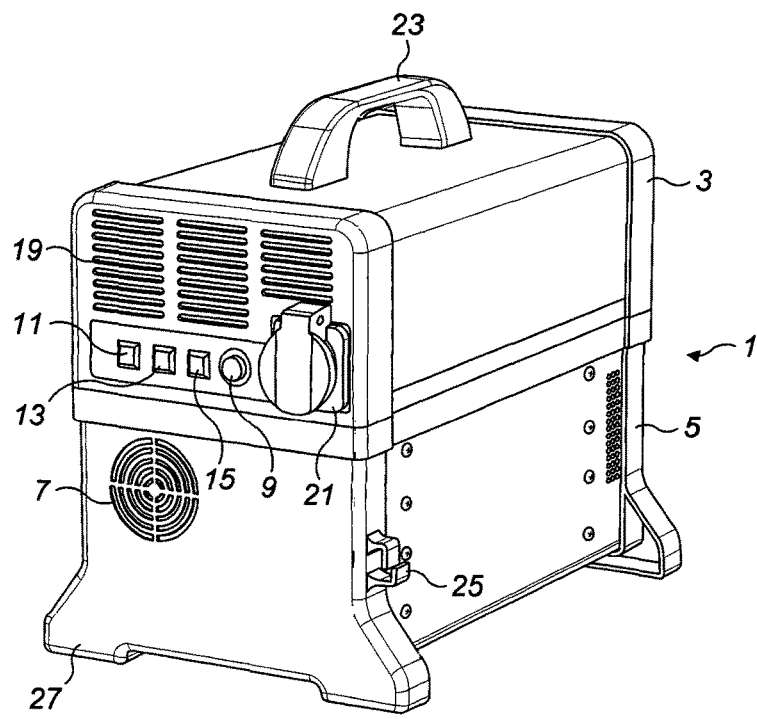
FIG. 1a is a perspective view of an embodiment of an ac power supply assembly n accordance with the present invention and FIG. 1b is a perspective view from the opposite end.

FIG. 1a shows an embodiment of a power supply assembly in accordance with the present invention from a first end. The power supply assembly 1 comprises a power inverter 3 which is removably connected to a battery 5. Accordingly, the power supply assembly is in two parts, the first part comprising an inverter and the second part comprising a battery which is replaceable. The power assembly has been created to allow a user to have a high power output from the assembly whilst using batteries which have a safe low voltage which is typically below 64V. By avoiding the use of high voltage batteries, the present invention can allow the batteries to be safely swapped over by a user so as to extend the operating tile of the AC power assembly.

The battery unit 5 of FIG. 1a shows a cell cooling air inlet 7 and a cable securing clip 25 on the outside of the unit and stabilising feet 27. The power inverter 3 is shown having an on/off/reset button 9 and LED indicator lights 11. The lights are green 11 showing AC power on, amber 13 for overload and red 15 which is an alarm light.

The inverter 3 has an air outlet 19 and a 230 V AC connector 21. The top surface of the inverter 3 has a carry handle 23. It should be noted that the AC power assembly of the present invention is designed to be portable and carried by one hand using the carry handle. Accordingly the power supply is of a weight and size suitable for achieving that purpose.

Figure 1B:
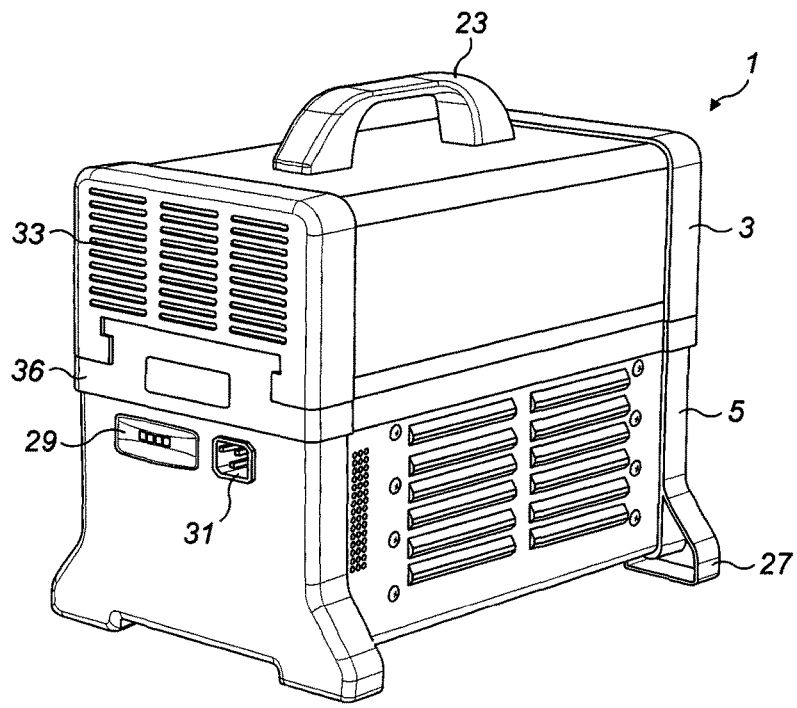

FIG. 1b is a perspective view of the AC power assembly from a second end. In this view, the battery is shown with a battery charge indicator 29, a charging connector 31 and an inverter release button 36 which when pressed allows the battery to be separated from the inverter in order to charge the battery or replace the battery if the use of a more charged battery is required.

The inverter air inlet and fans 33 are shown above the inverter release button and the cell cooling air outlet is shown on the side of the battery unit.

Figure 2:
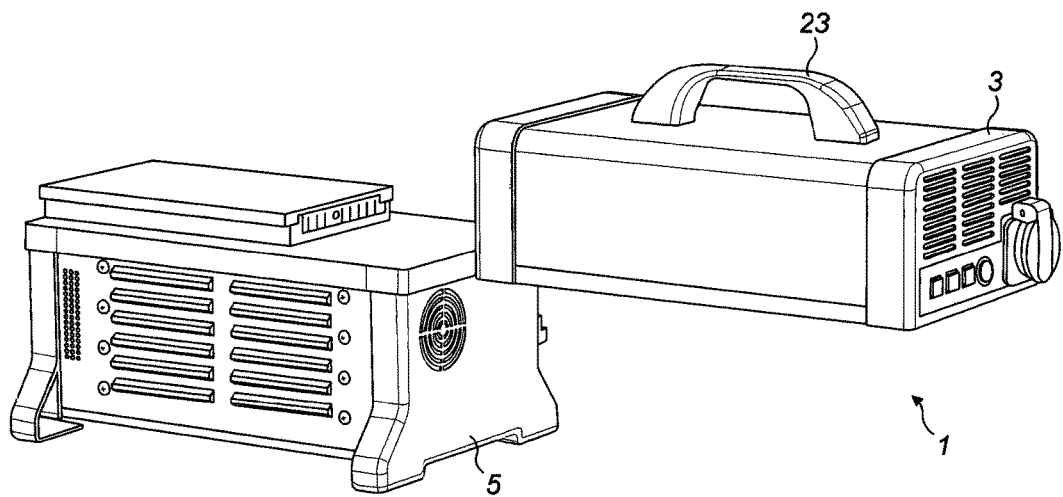
FIG. 2 is a perspective view on AC power supply with the Power inverter decoupled from the battery unit.

FIG. 2 is a perspective view of an AC power assembly in accordance with the present invention wherein the inverter 3 is decoupled from the battery 5. As can be seen, the top surface of the battery 5 has a battery unit coupling 37. The position of the inverter 3 to the right of the battery unit 5 is intended to show that the inverter 3 is decoupled from the battery unit 5 by a sliding motion which moves the inverter 3 and the battery 5 apart from one another once the release button has been pressed.

The coupling and release of an inverter and battery unit in accordance with the present invention may be achieved using other types of coupling mechanism which allows the two parts to be releaseably coupled together.

Figure 3:
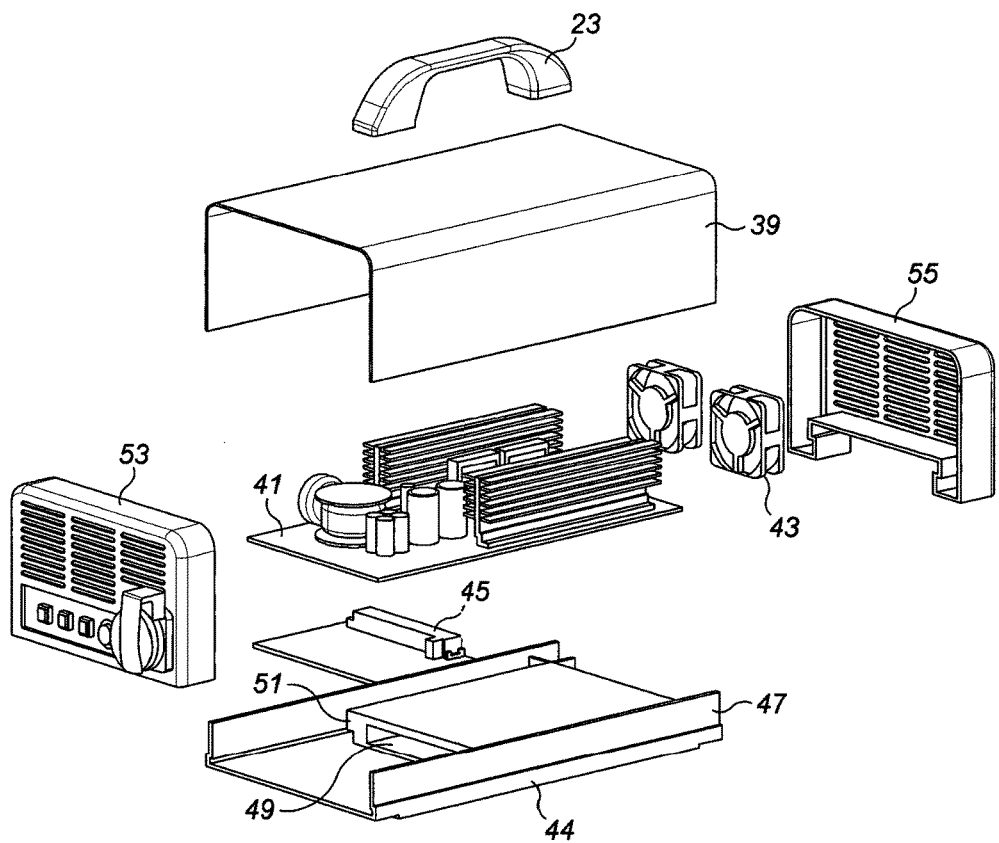
FIG. 3 is an exploded view of the power inverter in accordance with the present invention.
Figure 4:
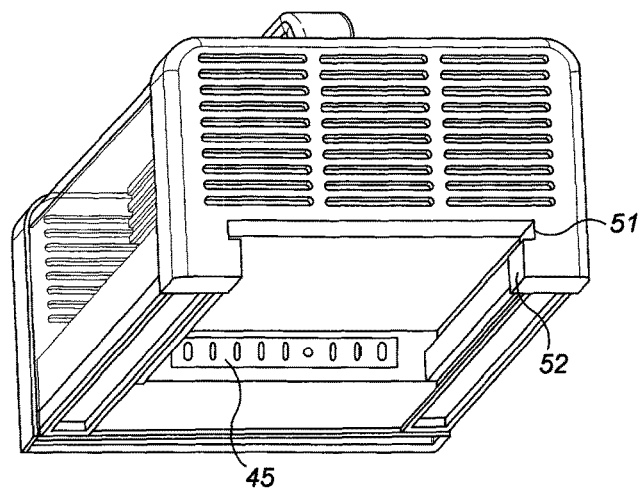
FIG. 4 is a perspective view of the power inverter which illustrates the coupling.

FIG. 3 is an exploded view of the inverter 3 in accordance with the present invention. The inverter 3 comprises a metal cover 39 which sits on top of inverter PCB assembly 41. Two cooling fans 43 are positioned behind the PCB assembly 41 beside a rear end cap 55. The inverter coupling 44 is formed from the inverter/battery connector 45 which sits on top of the inverter base 47. A recess 49 in the base 47 is shaped such that the inverter/battery connector 45 projects through the end face of the recess and is positioned for connection with a corresponding connector on the battery. As will be seen from FIGS. 3 and 4, the inverter coupling 44 forms a channel 51 which has a flange 52 which assists in securing the battery 5 in position when coupled to the inverter 3.

In this and other embodiments of the present invention, the inverter may comprise:
A mechanical enclosure;
DC/AC inverter electronics;
Electrical connector to interface with inverter;
AC power supply connector (for delivering power to a device); and
On/Off switch for AC power supply.
The inverter may also include:
Thermal management devices such as cooling fans;
Thermal management electronics;
LED indicator lights communicating state of AC power supply (performance and safety indicators);
Electronics reset button;
Carry handle; and
Mechanical locking mechanism for attaching to the battery.

Figure 5:
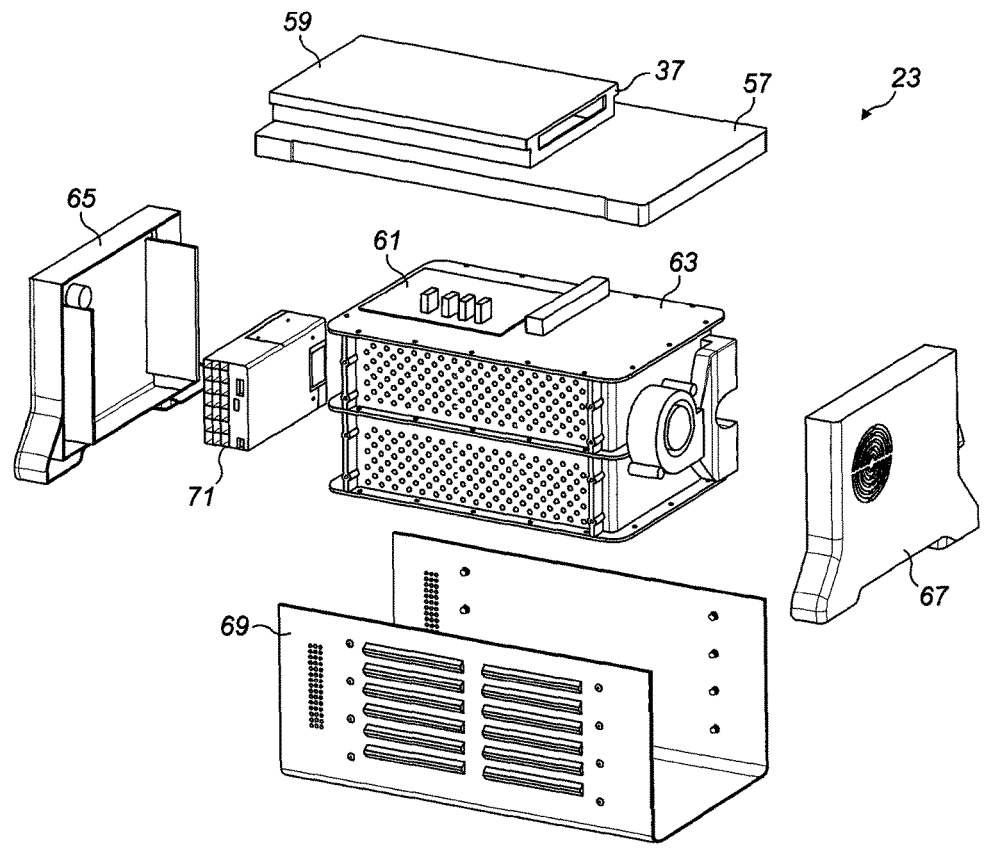
FIG. 5 is an exploded view of a battery unit in accordance with the present invention.

FIG. 5 is an exploded view of a battery 5 in accordance with the present invention. The battery coupling 37 extends outwards from the battery lid 57 and has a flange 59 which is sized to fit into the channel 51 of the inverter 3.

The battery further comprises a connector 61 which allows the battery to be coupled to a battery management system. Internally, the battery also has a cell housing, a cooling assembly 63 and a charge unit 71. These components are housed between a front and rear end cap 63, 65 respectively and a battery cover 69.

In this and other embodiments of the present invention, the battery may comprise:
A mechanical enclosure;
Battery cells;
AC/DC converter;
Battery management electronics;
Fuel gauge indicator;
AC charging connector (for charging battery from an AC power source); and
An electrical connector to interface with the Inverter.
The battery may also include:
Thermal management devices such as cooling fans;
Thermal management electronics;
Programming interface (USB);
Mechanical locking mechanism for attaching to the Inverter;
Actuated protective panel for charging and USB connectors; and
Battery management system, providing protection, battery performance enhancement and Cell balancing electronics.

Figure 6A:
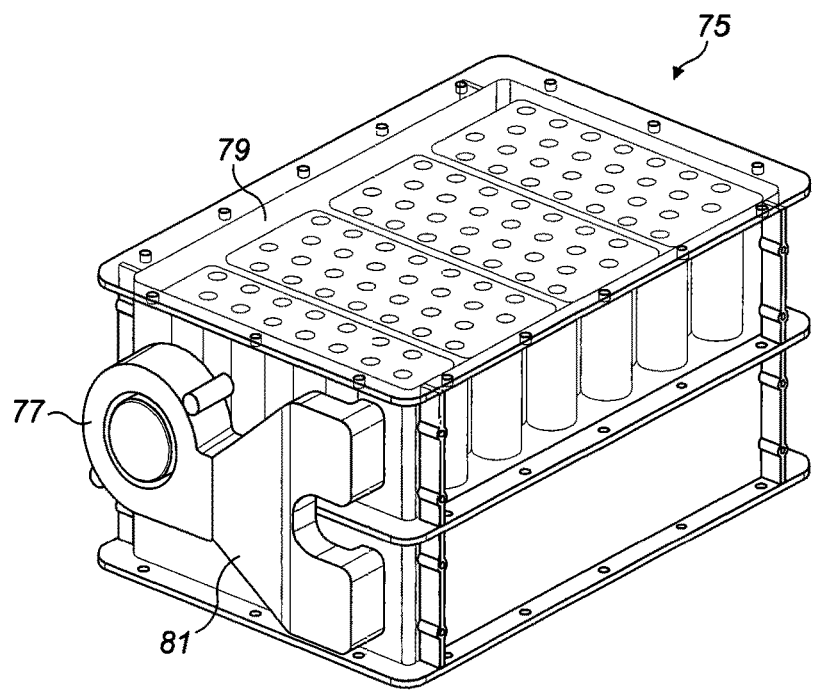
FIGS. 6a and 6b are perspective view which show the cell module and fan of the battery unit.
Figure 6B:
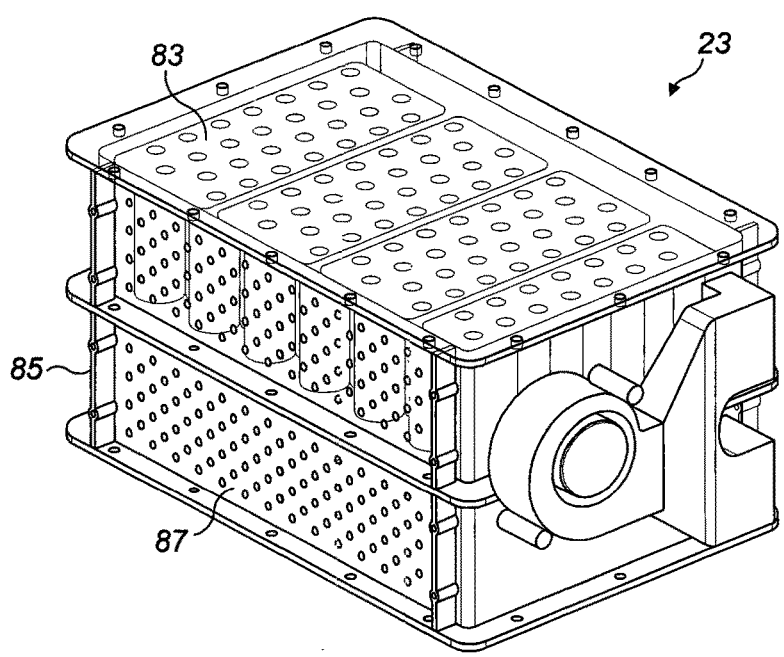
Figure 7:
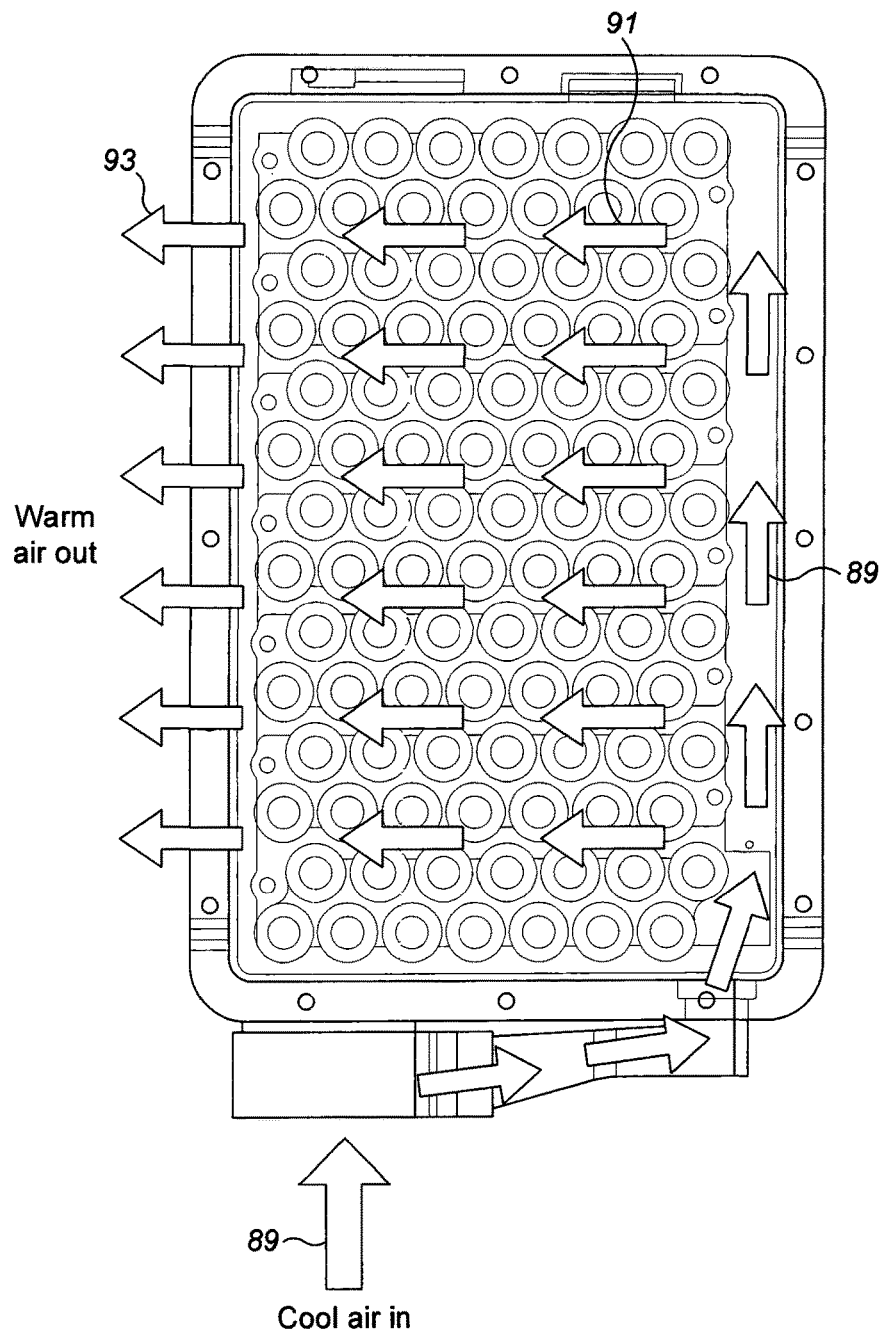
FIG. 7 is the plan view which shows air flow through the cells.

FIGS. 6a, 6b and 7 give an example of the cell module and cooling system 75 suitable for use in a battery used in the AC power assembly of the present invention. In this example a 48V DC blower fan connected to an air inlet manifold 81 provides cooling. The cells 83 are contained in two cell module boxes 79. A three part nylon housing 85 with an air outlet 87 is shown on the side of the cell module box 76. FIG. 7 shows the flow of cool air 89 into and through the cell module box 76 and the positions at which warmed air 93 exits the cell module box 76.

Figure 8:
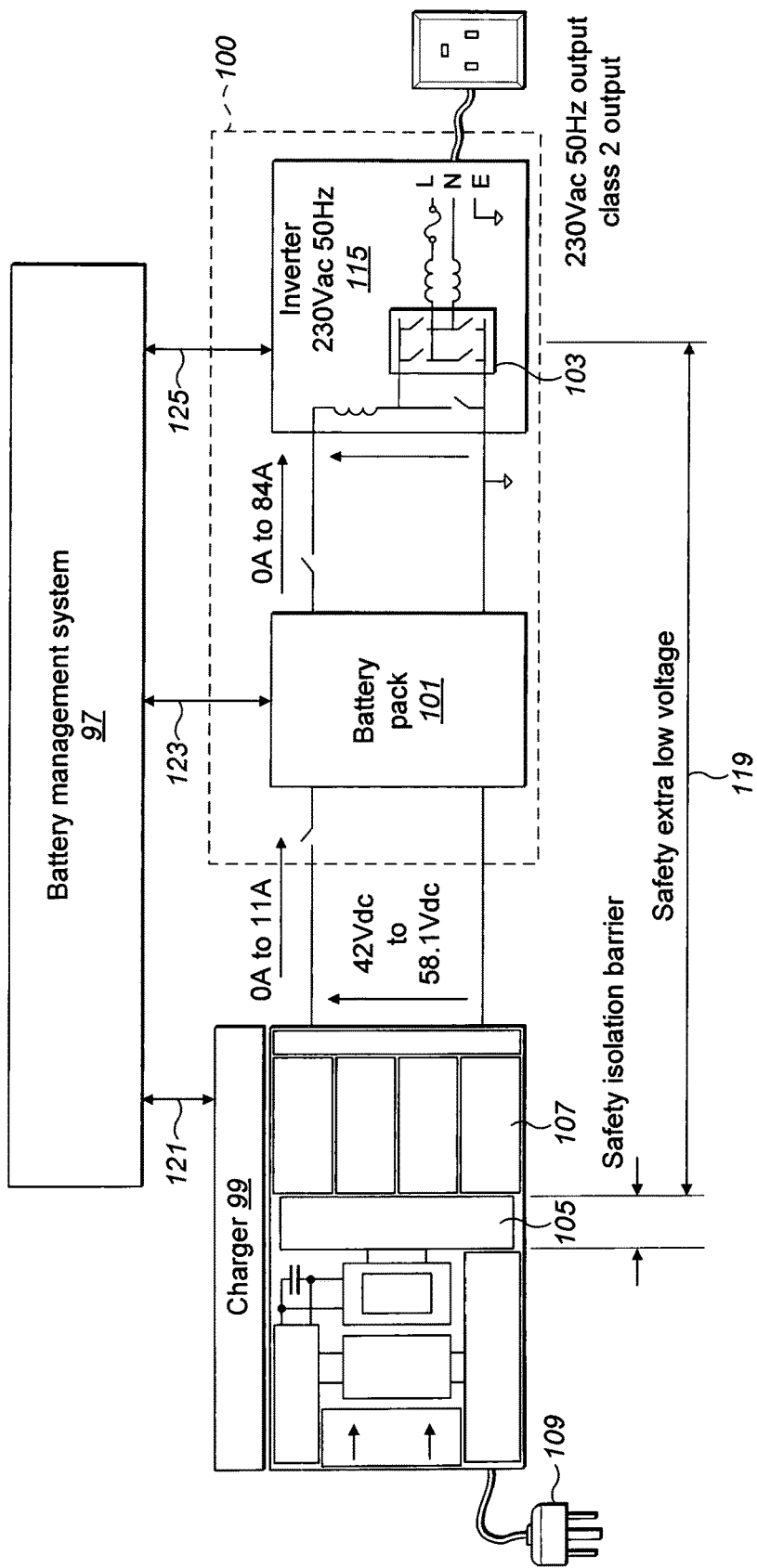
FIG. 8 is a schematic diagram which describes the operation of an AC power supply in accordance with the present invention.

FIG. 8 is a schematic diagram which shows the operation of a AC power supply assembly in accordance with the present invention. FIG. 8 shows a system 95 which contains a battery management system (BMS) 97 a charger 99 and AC power assembly 100 which comprises a battery 101 and a power inverter 103. In this embodiment of the invention the battery management system and charger form part of the battery.

The charger 99 has a transformer 105 coupled between a mains input 109 and a transformer output. The mains input is 230V AC and 50 Hz and is transformed to between 42V and 58V DC and up to 11 amps for charging the battery pack.

The battery pack provides a DC output to the inverter of 42 to 58 V up to 84 amps. The inverter converts this relatively low voltage back into an output AC signal of 230V or 110V at 50 Hz which is suitable for operating a 2 kW power tool or other device. Advantageously, when the charge in the battery pack is depleted, it can be easily replaced by a new one.

The battery management system is used to monitor and control the charge current and voltage from the charger 99. It also measures the cell voltage, cell temperature, battery voltage, battery current and controls charge and discharge in the battery. The BMS 97 also operates to control and monitor the performance of the inverter.

Advantageously, the present invention provides a more mobile, cleaner and quieter alternative to a diesel generator. This allows heavy power tools to be used indoors more readily and can also be transported and used by a single person (generators would require a two man lift).

By splitting into two parts, the AC power supply of the present invention allows the user to replace the depleted battery pack with a fully charged battery with the original inverter unit. The depleted battery pack can be put on charge while using the replacement battery pack. This provides the user with the capacity of 2 battery packs with only the additional weight of one inverter. Using 2 battery packs instead of one means the product can be easily transported by a single person/user.

The inverter can also potentially be connected to a range of battery modules of different sizes that have differing capacity vs weight ratios to suit the user or market needs.

It is envisaged that the present invention has particular utility in the supply of power for power tools used in construction industry. The device could be used in any application where a 230V power supply is required in a mobile form as a smaller quieter and less polluting alternative to small diesel generators.

Further advantages of the present invention are:

The mass of a heavy battery (of high capacity) can be replaced by two batteries of equivalent combined capacity which are individually more ergonomic entities that make it easier for the user to lift, handle and transport.

The user can chooses to transport or store as many batteries as is necessary for a specific application.

The user can receive continuous AC power supply if operating with a spare battery. The user can quickly employ the fully charged spare second battery while the original depleted battery is charged at a suitable AC power source.

Shipping of multiple smaller batteries is safer than shipping a single large battery.

Single entity mobile AC power supplies have to be retired when the battery has reached its operational life. However the operational life of the inverter exceeds that of a battery. Therefore a working inverter is needlessly scrapped despite not reaching its operational life. A two part power supply allows a retired battery to be replaced with a new one without sacrificing the original inverter. This saves the user money as the purchase price of a battery is less than that of a new AC power supply unit. This also saves on environmental waste.

Improvements and modifications may be incorporated herein without deviating from the scope of the invention.

The invention claimed is:

1. An alternating current power supply assembly which has an extendable operational period and which provides an external power supply for a tool, the power supply assembly comprising:
   a power inverter for converting direct current (DC) into alternating current (AC); and
   a removable battery unit which is connectable to the power inverter by a coupling to form the power supply and which when so connected forms a discrete unit and such that in use, a DC output from the removable battery unit is converted to an AC output from the power supply assembly by the power inverter, the operational period of the power supply assembly being extended by replacement of the battery unit when a portion of the energy in the battery unit has been used;
   wherein, the coupling comprises a recessed area on the underside of the inverter, the recessed area having an electrical connector and a mechanical connector, and a battery unit coupling which projects from the battery unit, and
   wherein the coupling provides an electrical connection between the power inverter and the battery unit and a mechanical coupling which removeably secures the power inverter to the battery unit.

2. An alternating current power supply as claimed in claim 1 wherein the alternating current is a pure sine wave alternating current.

3. An alternating current power supply assembly as claimed in claim 1 wherein, the power supply is designed to provide power to devices which require up to 3 kW RMS power.

4. An alternating current power supply assembly as claimed in claim 1 wherein, the mechanical connector is provided by a flanged lip, the recessed area forming a receiving channel.

5. An alternating current power supply assembly as claimed in claim 4 wherein, the battery unit coupling comprises an electrical connector and an abutting surface which provides a mechanical connection with the flanged lip when the connected thereto.

6. An alternating current power supply assembly as claimed in claim 1 wherein, the coupling comprises a male/female coupling.

7. An alternating current power supply assembly as claimed in claim 1 wherein, the coupling further comprises a lock.

8. An alternating current power supply assembly as claimed in claim 1 wherein, the power supply assembly has a weight of between 15 and 30 Kg.

9. An alternating current power supply assembly as claimed in claim 1 wherein, the power supply assembly has a height of between 10 and 40 cm.

10. An alternating current power supply assembly as claimed in claim 1 wherein, the power supply assembly has a breadth of between 10 and 40 cm.

11. An alternating current power supply assembly as claimed in claim 1 wherein, the power supply assembly has a depth of between 10 and 40 cm.

12. An alternating current power supply assembly as claimed in claim 1 wherein, the power supply assembly comprises a battery with a voltage of 35 to 64 volts DC.

13. An alternating current power supply assembly as claimed in claim 1 wherein, the power inverter is adapted to convert the DC voltage of the battery to provide an output from the power supply assembly which is 200 to 250v or 90 to 130V AC an a frequency of 40 to 60 Hz.

14. An alternating current power supply assembly as claimed in claim 1 wherein the inverter has a pure sinewave output.

15. An alternating current power supply assembly as claimed in claim 1 wherein, the power supply assembly further comprises a carry handle.

16. An alternating current power supply assembly as claimed in claim 15 wherein, the carry handle is situated on the top of the power supply assembly.

17. An alternating current power supply assembly as claimed in claim 15 wherein, the carry handle is situated on the top of the power inverter of the power supply assembly.

18. An alternating current power supply assembly as claimed in claim 1 wherein, the battery comprises a battery management system which is removeably connected to the inverter via the coupling.

19. An alternating current power supply assembly as claimed in claim 18 wherein, the battery management system is in communication with an integral charger, the battery and a load.

20. An alternating current power supply assembly as claimed in claim 19 wherein, the battery management system communicates with the load to detect and manage one or more of mains system power switching, battery disconnection, operating performance and load faults.

21. An alternating current power supply assembly as claimed in claim 19 wherein, the battery management system communicates with the charger to control the charge voltage and/or the charge current.

22. An alternating current power supply assembly as claimed in claim 19 wherein, the battery management system communicates with the charger to enable the charger and/or to detect power supply to the charger.

23. An alternating current power supply assembly as claimed in claim 19 wherein, the battery management system communicates with the battery to obtain fuel gauge information such as measure one or more of cell voltage, cell temperature, battery voltage and battery current.

24. An alternating current power supply assembly as claimed in claim 19 wherein, the baftery management system communicates with the battery to control battery charge and discharge.

25. An alternating current power supply assembly as claimed in claim 18 wherein, the battery management system further comprises software which creates a graphical user interface on a host device such as a personal computer where battery management information is displayable.

26. An alternating current power supply assembly as claimed in claim 1 wherein, the battery has a voltage of between 35 and 64V.

27. An alternating current power supply assembly as claimed in claim 26 wherein, the battery has a nominal voltage of 48V.

28. An alternating current power supply assembly as claimed in claim 26 wherein, the battery has a power output of between 1500 W and 2500 W.

29. An alternating current power supply assembly as claimed in claim 28 wherein, the battery has a power output of 1800 W.

30. An alternating current power supply assembly as claimed in claim 1 wherein, the power supply is designed to provide power to devices which require between 1 kW and 3 kW RMS power.

\* \* \* \* \*